US 7,443,575 B1

(12) United States Patent  
Iannone et al.

(10) Patent No.: US 7,443,575 B1  
(45) Date of Patent: Oct. 28, 2008

(54) DISCRETE HYBRID SOA-RAMAN AMPLIFIER WITH BROAD GAIN BANDWIDTH

(75) Inventors: Patrick P. Iannone, Red Bank, NJ (US); Kenneth C. Reichmann, Hamilton, NJ (US); Xiang Zhou, Middletown, NJ (US)

(73) Assignee: AT&T Corp, New York, NY (US)

( * ) Notice: Subject to any disclaimer, the term of this patent is extended or adjusted under 35 U.S.C. 154(b) by 0 days.

(21) Appl. No.: 11/412,645

(22) Filed: Apr. 27, 2006

(51) Int. Cl.  
*H01S 3/00* (2006.01)

(52) U.S. Cl. ..................................... 359/334

(58) Field of Classification Search ................. 359/334  
See application file for complete search history.

(56) References Cited

U.S. PATENT DOCUMENTS

| | | | |
|---|---|---|---|
| 7,126,747 B2 * | 10/2006 | Lee ............................ | 359/334 |
| 7,130,512 B2 * | 10/2006 | Kuksenkov et al. .......... | 385/122 |
| 2002/0191277 A1 * | 12/2002 | Chen et al. ................ | 359/341.4 |
| 2003/0063374 A1 * | 4/2003 | Inoue et al. ................. | 359/345 |
| 2004/0032887 A1 * | 2/2004 | Ahmadvand et al. ........... | 372/21 |
| 2004/0057735 A1 * | 3/2004 | Uesaka ....................... | 398/201 |
| 2005/0047788 A1 * | 3/2005 | Miyazaki .................... | 398/85 |
| 2005/0078354 A1 * | 4/2005 | Chang et al. ................ | 359/334 |
| 2005/0147370 A1 * | 7/2005 | Yusoff et al. ................ | 385/125 |
| 2006/0291037 A1 * | 12/2006 | Iannone et al. .............. | 359/334 |

OTHER PUBLICATIONS

Miyamoto et al. Highly Nonlinear Fiber-Based Lumped Fiber Raman Amplifier for CWDM Transmission Systems. Journal of Lightwave Technology, vol. 23, No. 11, Nov. 2005.*

Takahashi et al. Low-Loss and Low-Dispersion-Slope Highly Nonlinear Fibers. Journal of Lightwave Technology, vol. 23, No. 11, Nov. 2005.*

Amano et al. Hybrid dispersion compensating Raman amplifier module employing highly nonlinear fiber. OFCC 2003. Mar. 23-28, 2003. pp. 306-337. vol. 1.*

ITU Recommendation G. 694.2, Spectral Grids for WDM Applications: CWDM Wavelength Grid (Jun. 2002).

H. J. Thiele, L. Nelson, J. Thomas, B. Eichenbaum, L. Spiekman, and G. van den Hoven, "Linear optical amplifier for extended reach in CWDM transmission systems," OFC 2003, Atlanta, GA, paper MF21, Mar. 2003.

Y. Chen, R. Pavlik, C. Visone, F. Pan, E. Gonzales, A. Turukhin, L. Lunardi, D. Al-Salameh, and S. Lumish, "40 nm Broadband SOA-Raman Hybrid Amplifier," OFC 2002, Anaheim, CA, paper ThB7, Mar. 2002.

T. Miyamoto, T. Tsuzaki, T. Okuno, M. Kakai, M. Hirano, M. Onishi, M. Shigematsu, and M. Nishimura, "Highly-Nonlinear-Fiber-Based Discrete Raman Amplifier for CWDM Transmission Systems," OFC 2003, Atlanta, GA, paper MF19, Mar. 2003.

L. H. Spiekman et al., "8×10 Gb/s DWDM Transmission over 240 km of Standard Fiber Using a Cascade of Semiconductor Optical Amplifiers," IEEE Photon Tech. Lett., vol. 12, pp. 1082-1084, 2000.

P. Iannone, K. Reichmann, X. Zhou and N. Frigo, "200 km CWDM Transmission Using a Hybrid Amplifier," paper OThG3, OFC Mar. 2005.

* cited by examiner

*Primary Examiner*—Deandra M Hughes

(57) ABSTRACT

A discrete hybrid amplifier is disclosed for use in optical fiber systems. The amplifier uses one or more Raman laser pumps together with semiconductor optical amplifiers in series to produce a relatively level gain across the frequency range of interest. The Raman pump utilizes a length of highly nonlinear fiber as the gain medium. The disclosed lower-cost hybrid amplifier is especially useful in coarse wavelength division multiplexing (CWDM) systems and in local access portions of the network.

15 Claims, 3 Drawing Sheets

DISCRETE HYBRID SOA-RAMAN AMPLIFIER WITH BROAD GAIN BANDWIDTH

FIELD OF THE INVENTION

The present invention relates generally to transporting optical signals on an optical fiber over moderate distances. More particularly, the present application relates to a discrete hybrid amplifier, using semiconductor optical amplifier and Raman amplifier components. The hybrid amplifier is especially useful in coarse wavelength division multiplexing transmission systems, and at network edges.

BACKGROUND OF THE INVENTION

Although low-loss optical fiber, reliable laser transmitters and low-noise optical receivers have been commercially deployed in fiber optic transmission systems since the early 1980s, it was not until the deployment of reliable commercial optical amplifiers in the early 1990s that the high capacity and low cost-per-bit of wavelength-division multiplexed (WDM) transmission systems could be realized. The introduction of the erbium-doped fiber amplifier (EDFA) revolutionized optical communications by simultaneously amplifying a multiplicity of WDM channels. A single N-channel EDFA replaced N costly regenerators, each composed of an optical-to-electrical converter, a re-timing circuit, a decision circuit, an electronic amplification circuit, and a laser transmitter.

Surprisingly, more than 10 years after its commercial introduction, the EDFA remains the only broadly deployed optical amplifier technology. This, despite the fact that the EDFA has a limited optical bandwidth (under 40 nm) and generally operates only in the C-band (1530-1560-nm wavelength). Although more versatile amplifiers have been demonstrated in the lab, such as semiconductor optical amplifiers (SOA) and Raman amplifiers, those technologies have not gained commercial acceptance due to their inability to compete with the low cost and high performance of EDFAs.

Semiconductor optical amplifiers (SOA) are based on the same mature processing technology as commercial semiconductor lasers. They are far more compact than EDFAs, have the potential for significant cost advantages relative to EDFAs, and have long been considered a natural candidate for use as line amplifiers in WDM transmission systems.

Demonstrations of SOA-based amplified transmission systems predate the invention of the EDFA. SOAs, however, have failed to gain acceptance as a viable WDM amplifier for several reasons, including:

1) Commercial EDFAs can be produced with higher gains and higher output powers than can SOAs.

2) Producing amplifiers with low polarization-dependent gain (PDG) is more challenging for SOAs than for EDFAs.

3) Due to the differences in carrier lifetimes in the two gain media, SOAs are susceptible to inter-channel gain-saturation-induced crosstalk, while EDFAs are largely immune to that adverse effect.

4) SOAs suffer from pronounced gain variations across optical bandwidths typical of WDM systems, while EDFA technology is amenable to the production of multi-stage amplifiers which can incorporate gain-flattening filters and other devices to improve amplifier performance without adversely affecting the amplifier noise figure.

Over the past several years that situation has begun to turn around. Processing improvements have resulted in SOAs with higher gains, higher output powers, and lower PDG. Although modern EDFAs still outperform the latest generation of SOAs, network designers are reconsidering SOAs as the demand for optical networking solutions has increasingly moved from the highly aggregated core network (where performance considerations outweigh cost issues) to the edge of the network (where high performance is often a lower priority than cost and flexibility).

Just as SOA technology was evolving with an eye toward reducing the cost of longer-reach dense wavelength-division multiplexed (DWDM) offerings for this cost-sensitive new market, coarse wavelength division multiplexing (CWDM)—an entirely new un-amplified WDM standard—arose as a low-cost short-reach solution. With optical channel spacings 25-50 times those of standard DWDM, CWDM trades off reach and capacity for cost. CWDM is presently considered an un-amplified technology due to the unavailability of amplifiers that can operate over the wide optical band of a typical system (1470-1610 nm for an 8-channel system). SOAs, which can be engineered to operate at any wavelength within the 1300-1650 nm low-loss region of optical fiber, and typically have a broader band of operation than EDFAs, have been proposed as amplifiers capable of both extending the reach of CWDM systems and reducing the cost of metro DWDM systems (while increasing their flexibility). In the case of CWDM, the SOA gain bandwidth is sufficient to amplify 4 CWDM channels simultaneously. Unfortunately, the best of today's commercially available SOAs still exhibit significant gain variations across the operating band, rendering them unsuitable for most practical CWDM (and DWDM) applications.

The inventors have demonstrated that by combining an SOA with a moderate-gain distributed Raman amplifier, the SOA gain variation can be significantly reduced, the net optical bandwidth can be increased, and the net gain can be increased. Because the Raman gain spectrum in silica fiber has a "ramp" shape, increasing with wavelength until it peaks at roughly 100 nm to the long-wavelength side of the Raman pump wavelength, it is well suited to compensating the monotonic decrease in gain to the long-wavelength side of the SOA gain peak. The SOA provides the bulk of the gain while the Raman gain provides gain tilt compensation. That configuration has an additional benefit in that the information-bearing signals may be positioned to the long-wavelength side of the SOA gain peak (where saturated output powers are highest), resulting in reduced cross-gain modulation in the SOA. The distributed hybrid amplifier 100, shown schematically in FIG. 1, consists of an SOA 140, a Raman pump laser 120, a pump coupler 130, an optical isolator 150, and a long length of single-mode optical fiber 110 that serves as both the transmission fiber and the Raman gain medium.

The amplifier 100 is said to be a "distributed" amplifier because the Raman gain is distributed along the length of the transmission fiber 110. In FIG. 2 is shown a plot 200 of the gain vs. wavelength of the hybrid amplifier and its constituent stages. The triangles 230 represent operation of the SOA alone and show a gain tilt of 6.6 dB over a CWDM 4-channel band 210 between 1510 nm and 1570 nm. The diamonds 220 illustrate the Raman gain (increasing by 5.7 dB from 1510 to 1570 nm) achieved by counter-propagating a commercial tunable fiber Raman laser supplying 300 mW of pump power at 1475 nm wavelength through 80 km of reduced water peak standard single mode fiber. That pump wavelength was chosen to produce a Raman gain spectrum which peaks at approximately 1575 nm. The hybrid combination, indicated by the squares 250, shows the compensated SOA gain tilt with nearly flat response (0.9 dB variation) over the four CWDM channels with a minimum gain of 16.1 dB. The Raman pump power was intentionally limited to 300 mW to stay within the range of readily available and relatively inexpensive commercial semiconductor Raman pumps.

The data in FIG. 2 represents one instantiation of the above-described distributed amplifier design. With proper choice of SOA and Raman pump wavelength, similar results could have been demonstrated over any band within the wavelength range 1300-1650 nm.

There have been several recent demonstrations of "discrete" optical amplifiers that display wider optical bandwidth, but at a substantial increase in cost. A "discrete" optical amplifier, as opposed to a "distributed" optical amplifier, does not utilize the transmission fiber for amplification. Those broadband amplifier demonstrations have taken advantage of doped fiber amplification (the physical mechanism behind the EDFA) and discrete Raman amplification (using a shorter section of dedicated, highly non-linear fiber (HNLF)).

As mentioned previously, erbium-doped fiber amplifiers (EDFA) are nearly ideal for optical communication applications, due to their maturity, low multi-channel crosstalk, high gain, high output powers, and gain flatness. Unfortunately, commonly available C-band EDFAs cover less than two CWDM channels, and do not have the versatility to operate over any band within the low-loss window of optical fiber.

For example, a new hybrid doped-fiber amplifier is described in T. Sakamoto et al., "Rare-Earth-Doped Fiber Amplifier for Eight-Channel CWDM Transmission Systems," Optical Fiber Communication Conference and Exhibit 2004, Los Angeles, Calif., paper ThJ5 (March 2004). That amplifier combines three doped fiber amplifier technologies in two branches. One branch consists of an EDFA in series with a thulium-doped fiber amplifier (TDFA). A second, parallel branch consists of an erbium-doped tellurite fiber amplifier (EDTFA). That arrangement promises impressive performance with relatively flat gain of 22.5 dB over the conventional 8-channel CWDM band from 1463 mm to 1617 nm, but is complex, has a high component count, and relies on immature technology, all of which contribute to a high cost for this approach.

Discrete Raman amplification, which can be tailored to a particular wavelength region and gain bandwidth by judicious choice of pump wavelengths and powers, has been demonstrated over the conventional 8 channel CWDM band by the authors of T. Miyamoto et al., "Highly-Nonlinear-Fiber-Based Discrete Raman Amplifier for CWDM Transmission Systems," Optical Fiber Comm. Conf. and Exhibit 2003, Atlanta, Ga., paper MF19 (March 2003). Their design, using HNLF to increase conversion efficiency, employed six pump lasers with various wavelengths and powers. One, at 1360 nm, was used in both the forward and reverse directions with powers of 211 mW and 614 mW, respectively. Diode laser pumps with output powers above 500 mW are not only more costly than lower power pumps, but are considered Class IV lasers and therefore require more stringent (and costly) laser safety procedures of both vendors and network operators. The remaining pumps had more moderate powers ranging from 236 mW to 7 mW. That design, while simpler than the rare earth doped fiber amplifier mentioned previously, has a lower net gain of approximately 10 dB and is still considered too complex and costly for metro and access applications.

There remains a need for a cost-effective amplifier that is useful with commercially-available CWDM systems, particularly at network edges and in metro and access areas, while minimizing the above-described disadvantages.

SUMMARY OF THE INVENTION

The present invention addresses the needs described above by providing a method and system for amplifying an optical signal in an optical fiber. One embodiment is an amplifier system for amplifying a data-bearing optical signal within a wavelength range including at least one optical wavelength signal channel. A "data-bearing optical signal," as used herein, may include one or more than one optical signal. For example, a data-bearing optical signal as that term is used herein may include several signals of different wavelengths.

The system comprises an optical highly non-linear fiber (HNLF) having a first end for introducing the data-bearing optical signal, a Raman pump laser coupled to a second end of the HNLF for introducing a Raman pump signal into the HNLF, and at least one semiconductor optical amplifier (SOA) coupled to the second end of the highly non-linear optical fiber for introducing a Raman-amplified signal and producing a hybrid-amplified signal.

The Raman pump laser may have a pumping wavelength below the wavelength range. A gain of the at least one Raman pump may increase within the wavelength range, while the gain of the at least one SOA decreases within the wavelength range. In that case, a sum of the gains may be more constant over the wavelength range than the individual gains, or may have a broader bandwidth than the individual gains.

The HNLF may include a solid core fiber, or a microstructure fiber, and may be a dispersion-compensating fiber. The HNLF may be under 5 kilometers in length, or, in another embodiment, may be under 3 km. The system may further comprise an optical isolator coupled to an output of the SOA, and may further comprise a wavelength-selective pump coupler (or broadband optical circulator) coupled to the second end of the HNLF, for coupling the Raman pump laser to the second end of the HNLF.

The data-bearing optical signal may comprise CWDM channels, in which case the data-bearing optical signal may include four CWDM channels.

Another embodiment of the invention is a method for amplifying an optical signal within a wavelength range including at least one optical wavelength signal channel. The method comprises the steps of introducing a reverse Raman pumping signal into an optical highly non-linear fiber (HNLF), transmitting the optical signal in a forward direction through the HNLF, and further amplifying the optical signal using a semiconductor optical amplifier (SOA).

The Raman pumping signal may have a wavelength below the wavelength range. A gain of the Raman pumping signal may increase within the wavelength range, while the gain of the SOA decreases within the wavelength range. The sum of the gains may be more constant over the wavelength range than the individual gains, or may have a broader bandwidth than the individual gains.

The method may further comprise the step of transmitting an output of the SOA through an optical isolator.

The step of introducing a reverse Raman pumping signal into the HNLF may include introducing the Raman pumping signal through an optical coupler. The step of transmitting the optical signal may further include transmitting the optical signal in CWDM channels. In that case, the at least one optical wavelength signal channel may comprise four CWDM channels.

Another embodiment of the amplifier includes at least one semiconductor optical amplifier (SOA) having an input for introducing the data-bearing optical signal, an optical highly non-linear fiber (HNLF) having a first end coupled to an output of the at least one SOA, and a Raman pump laser coupled to a second end of the HNLF for introducing a Raman pump signal into the HNLF to thereby produce a hybrid-amplified signal at the second end of the HNLF.

DESCRIPTION OF THE INVENTION

The inventors have developed a low cost discrete hybrid SOA-Raman amplifier capable of simultaneously amplifying multiple WDM channels over a broad optical band (up to ~80 nm) with a center wavelength that can be specified (with the proper choice of Raman pump wavelength and SOA) over the entire low-loss band in optical fiber (~1300-1600 nm). The commercial availability of such an amplifier could open the door to far more flexible and efficient optical networks, particularly in the metro and access portions of the network where flexibility and low cost are paramount.

A potential drawback of the distributed hybrid amplifier described above is the fact that the Raman gain occurs along the transmission fiber. To that point, service providers have been reluctant to deploy distributed Raman amplifiers for several reasons:

1) The overall Raman gain is dependent on the type, batch, and manufacturer of the transmission fiber as well as any additional losses or reflections in the transmission span due to micro-bends, splices or connectors. Should a particular span have high discrete losses or reflections (particularly over the last few kilometers of the span, where the backward propagating pump light is most intense), the trouble spots would have to be isolated and repaired (thus increasing the cost of the installation).

2) The introduction of relatively high-power Raman pump signals into the transmission fiber increases the cost associated with meeting eye-safety standards and practices.

The costs and performance variations associated with distributed Raman amplification can be avoided in a discrete Raman amplifier, in which the Raman gain medium is a separate length of HNLF. Thus, the entire Raman amplifier is a discrete "black box" containing the HNLF, pump coupler, pump laser, and isolator, with well-specified performance independent of the transmission fiber.

Figure 1:
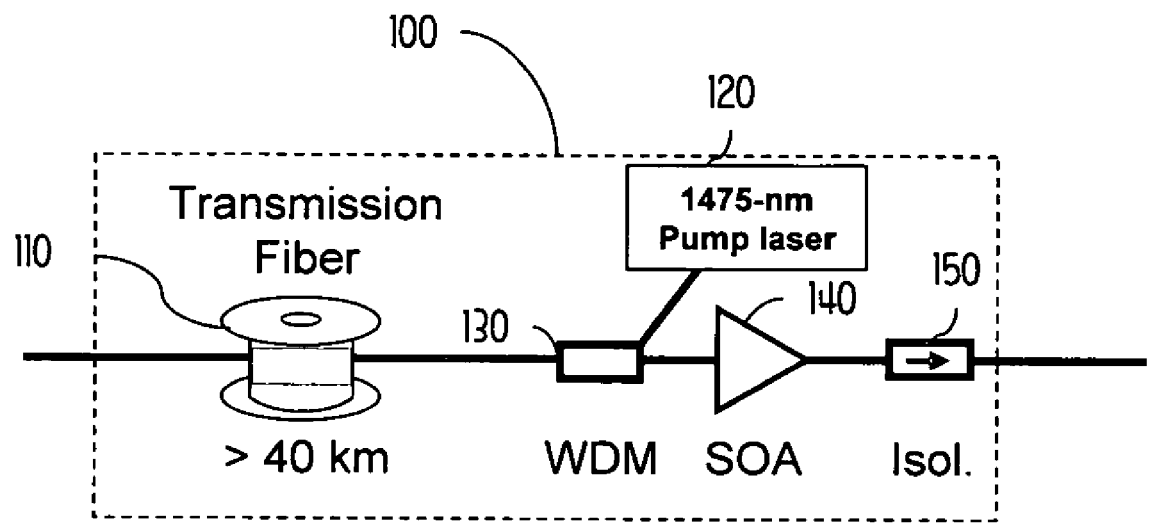
FIG. 1 is a schematic representation of a prior art hybrid amplifier.
Figure 2:
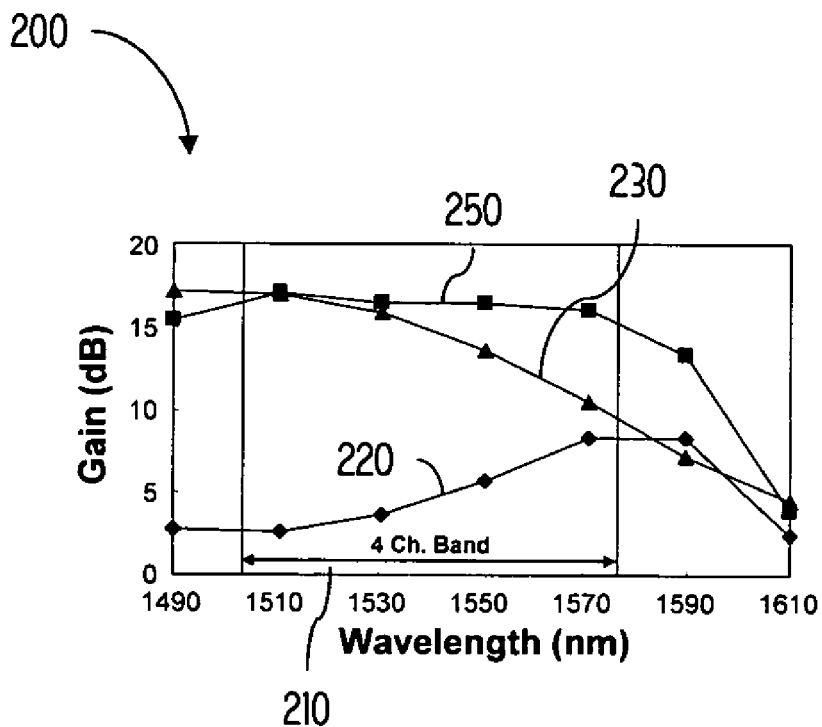
FIG. 2 is a gain versus wavelength plot representing several components of the amplifier of FIG. 1.
Figure 3:
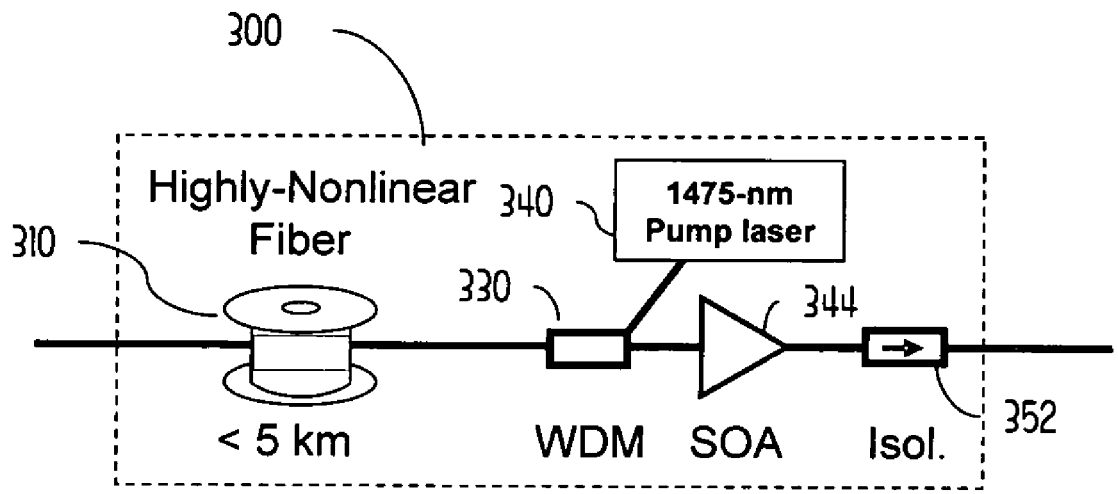
FIG. 3 is a schematic representation of a hybrid amplifier according to one embodiment of the invention.

The inventors have developed a discrete hybrid SOA-Raman amplifier, having some characteristics of the hybrid amplifier described above, and utilizing as a Raman gain medium a relatively short length of HNLF rather than the long length of transmission fiber. A proposed discrete hybrid amplifier 300 is shown schematically in FIG. 3. The amplifier 300 includes a highly non-linear fiber 310 and a Raman pump laser 340 coupled to the HNLF through a wavelength-selective coupler 330 (or broadband optical circulator). The hybrid amplifier further includes an SOA 344 and an optical isolator 352.

The highly nonlinear fiber 310 is characterized by a nonlinear index of refraction that is large in comparison to that in conventional transmission fibers, and can be realized in several different forms including solid-core fibers and so-called microstructure fibers, also known as holey fibers or photonic crystal fibers. The fibers may further be dispersion-compensating fibers. The HNLF is under 10 kilometers in length and may be under 5 kilometers. The inventors have conducted successful experiments with an HNLF approximately 3 kilometers in length. Shorter fibers will permit more compact designs. The use of holey fiber or microstructure fiber as the HNLF would result in a further significant decrease in the length of the HNLF.

Figure 4:
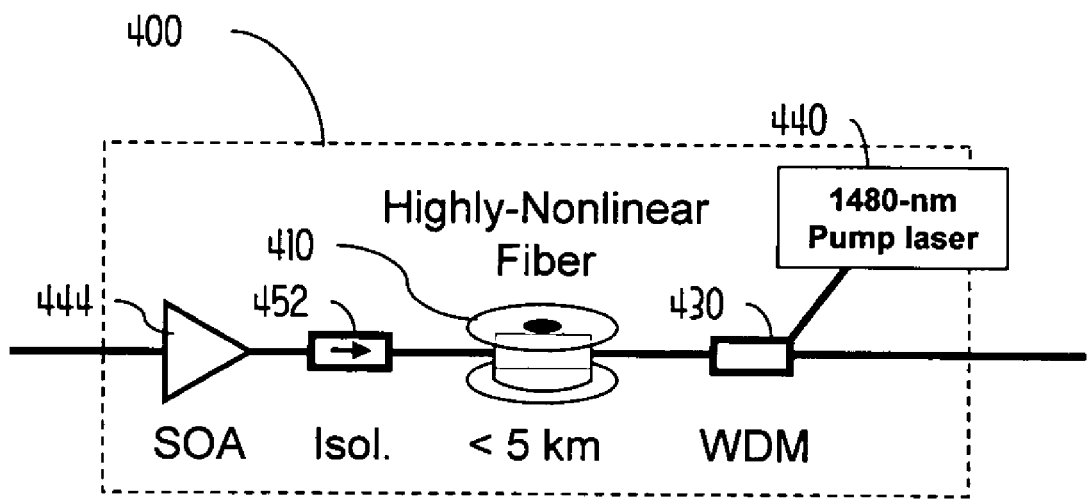
FIG. 4 is a schematic representation of a hybrid amplifier according to another embodiment of the invention.

As shown by the hybrid amplifier 400 of FIG. 4, the ordering of the Raman gain stage (HNLF 410, pump coupler 430, and pump laser 440) and the SOA stage (SOA 444 and isolator 452) may be reversed without adversely affecting the gain of the hybrid amplifier. Whether to choose the order shown in FIG. 3. or the reverse order shown in FIG. 4 depends on the noise and power handling properties of the two stages.

The more conventional doped-core HNLF fibers with relatively large index of refraction change between the core and cladding (Δn) typically have nonlinear coefficients that exceed those in standard transmission fibers by an order of magnitude or more. For example, an HNLF may have nonlinear coefficients $10\ W^{-1}\ km^{-1} \leq \gamma \leq 21\ W^{-1}\ km^{-1}$, as compared to $\gamma = 1.3\ W^{-1}\ km^{-1}$ for standard single-mode fiber. Microstructure fibers have recently been demonstrated with γ exceeding that in standard fiber by a factor of 1000 or more; however, that technology is immature and may require several years before commercialization.

The presently-described discrete amplifier design has the advantage of broadband operation (up to ~80 nm) over any part of the low-loss window in optical fiber (1300 nm-1650 nm). Since the bulk of the gain is derived from an inexpensive SOA, with the Raman gain primarily providing gain-tilt compensation, the overall amplifier subsystem is relatively inexpensive.

Figure 5:
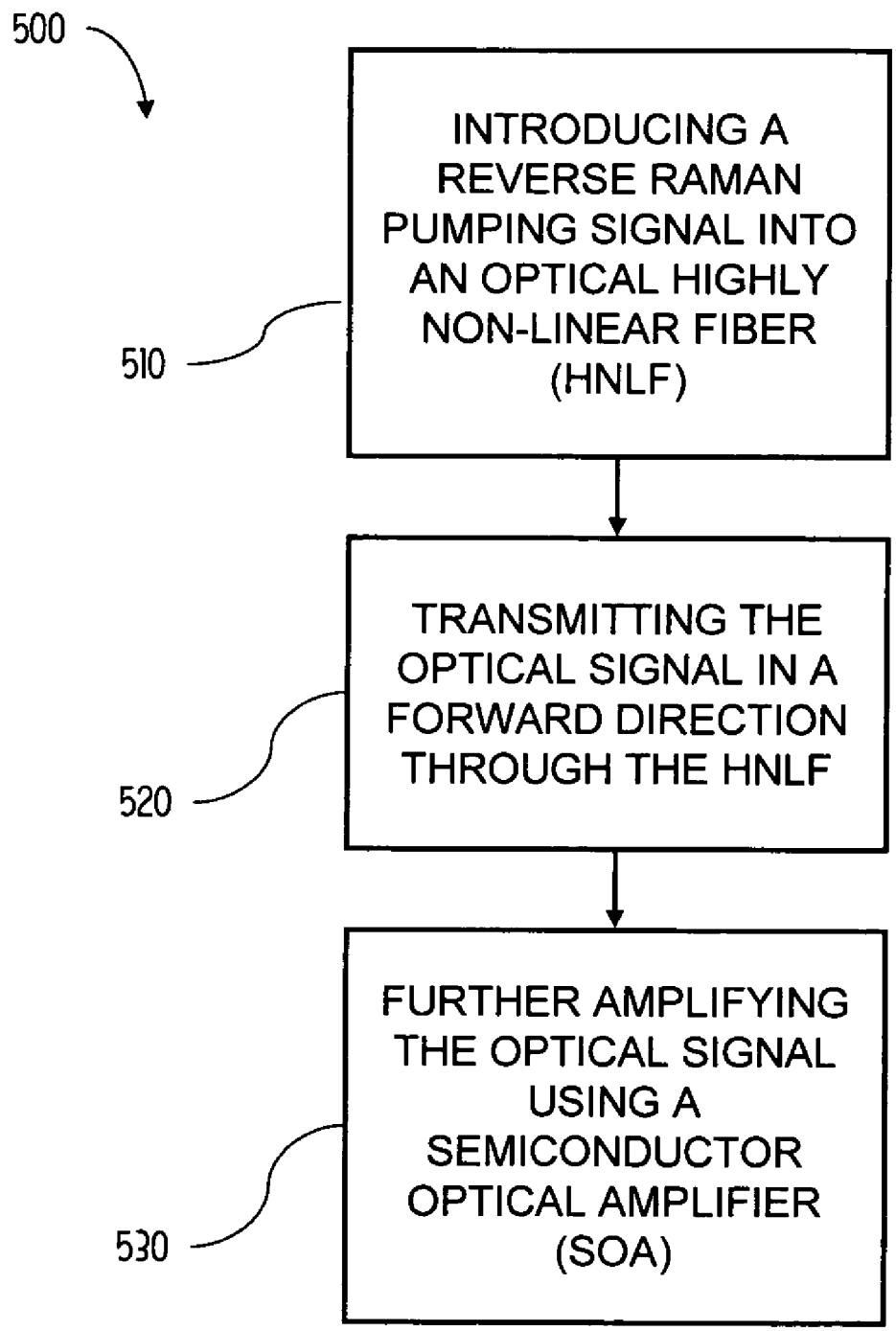
FIG. 5 is a flow chart showing a method according to one embodiment of the invention.

The invention described herein further contemplates a method 500, shown in FIG. 5, for amplifying an optical signal within a wavelength range including at least one optical wavelength signal channel. The method comprises the steps of introducing (step 510) a reverse Raman pumping signal into an optical highly non-linear fiber (HNLF), transmitting (step 520) the optical signal in a forward direction through the HNLF, and further amplifying (step 530) the optical signal using a semiconductor optical amplifier (SOA).

The above described invention provides a flexible, relatively high-performance discrete hybrid SOA-Raman amplifier suitable for commercialization in the cost-sensitive metro-area and local-access portions of the network. The amplifier has performance similar to a distributed hybrid SOA-Raman amplifier, but its discrete implementation will eliminate potential performance degradations caused by non-idealities in the transmission fiber as well as concerns related to eye safety.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. For example, while the method of the invention is described herein with respect to optical transmission using CWDM, the method and apparatus of the invention may be used with other optical multiplexing schemes where cost, safety and self-containment are important factor. It is to be understood that the embodiments shown and described herein are only illustrative of the principles of the present invention and that various modifications may be implemented by those skilled in the art without departing from the scope and spirit of the invention.

What is claimed is:

1. An amplifier system for amplifying a data-bearing optical signal within a wavelength range including at least one optical wavelength signal channel, comprising:
   an optical highly non-linear fiber (HNLF) comprising a first end for introducing the data-bearing optical signal;
   a Raman pump laser coupled to a second end of the HNLF for introducing a Raman pump signal into the HNLF; and
   at least one semiconductor optical amplifier (SOA) coupled to the second end of the highly non-linear optical fiber for introducing a Raman-amplified signal and producing a hybrid-amplified signal;
   wherein the HNLF is a dispersion-compensating fiber.

2. The system of claim 1, wherein the Raman pump laser has a pumping wavelength below the wavelength range.

3. The system of claim 1, wherein a gain of the at least one Raman pump increases within the wavelength range, and a gain of the at least one SOA decreases within the wavelength range.

4. The system of claim 3, wherein a sum of the gains is more constant over the wavelength range than the individual gains.

5. The system of claim 3, wherein a sum of the gains has broader bandwidth than the individual gains.

6. The system of claim 1, wherein the HNLF comprises a solid core fiber.

7. The system of claim 1, wherein the HNLF comprises a microstructure fiber.

8. The system of claim 1, wherein the HNLF is less than 5 kilometers in length.

9. The system of claim 1, wherein the HNLF is 3 kilometers or less in length.

10. The system of claim 1, further comprising:
    an optical isolator coupled to an output of the SOA.

11. The system of claim 1, further comprising:
    a pump coupler coupled to the second end of the HNLF, for coupling the Raman pump laser to the second end of the HNLF.

12. The system of claim 11, wherein said pump coupler is a wavelength-selective coupler.

13. The system of claim 11, wherein said pump coupler is a broadband optical circulator.

14. The system of claim 1, wherein the data-bearing optical signal comprises CWDM channels.

15. The system of claim 14, wherein the data-bearing optical signal comprises four CWDM channels.

* * * * *